US006818564B1

(12) United States Patent
Gormley

(10) Patent No.: US 6,818,564 B1
(45) Date of Patent: Nov. 16, 2004

(54) METHOD FOR ETCHING A TAPERED BORE IN A SILICON SUBSTRATE, AND A SEMICONDUCTOR WAFER COMPRISING THE SUBSTRATE

(75) Inventor: Colin Stephen Gormley, Belfast (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/324,603

(22) Filed: Dec. 20, 2002

Related U.S. Application Data

(60) Provisional application No. 60/342,597, filed on Dec. 20, 2001.

(51) Int. Cl.[7] ...................... H01L 21/302; H01L 21/461
(52) U.S. Cl. ......................... 438/734; 438/43; 438/701; 438/713
(58) Field of Search ........................... 438/43, 71, 667, 438/694, 695, 701, 702, 713, 734, 906, 971, 455

(56) References Cited

U.S. PATENT DOCUMENTS

| | | | | |
|---|---|---|---|---|
| 5,501,893 | A | * 3/1996 | Laermer et al. | ............ 428/161 |
| 6,341,039 | B1 | 1/2002 | Flanders et al. | |
| 6,373,632 | B1 | 4/2002 | Flanders et al. | |
| 6,468,889 | B1 | * 10/2002 | Iacoponi et al. | ............ 438/597 |
| 2001/0028503 | A1 | 10/2001 | Flanders et al. | ............ 359/578 |
| 2002/0018385 | A1 | 2/2002 | Flanders et al. | |

FOREIGN PATENT DOCUMENTS

| | | |
|---|---|---|
| WO | WO 01/67156 | 9/2001 |
| WO | WO 01/67157 | 9/2001 |
| WO | WO 01/67158 | 9/2001 |
| WO | WO 01/67171 | 9/2001 |

* cited by examiner

Primary Examiner—George Fourson
Assistant Examiner—Julio J. Maldonado
(74) Attorney, Agent, or Firm—Gauthier & Connors LLP

(57) ABSTRACT

A semiconductor wafer comprises an SOI comprising a device layer on an oxide layer supported on a handle layer. Micro-mirrors are formed in the device layer, and access bores extend through the handle layer and the oxide layer to the micro-mirrors for accommodating optical fibers to the micro-mirrors. The access bores are accurately aligned with the micro-mirrors, and the access bores are accurately formed of circular cross-section. Each access bore comprises a tapered lead-in portion extending to a parallel portion. The diameter of the parallel portion is selected so that the optical fibers are a tight fit therein for securing the optical fibers in alignment with the micro-mirrors. The tapered lead-in portions of the access bores are formed to a first depth by a first dry isotropic etch for accurately forming the taper and the circular cross-section of the tapered lead-in portions. The parallel portions are formed from the first depth to a second face of the handle layer by a second dry etch, namely, an anisotropic etch carried out using the Bosch process. By so etching the access bores the access bores are accurately formed of circular transverse cross-section and of accurate dimensions.

28 Claims, 4 Drawing Sheets

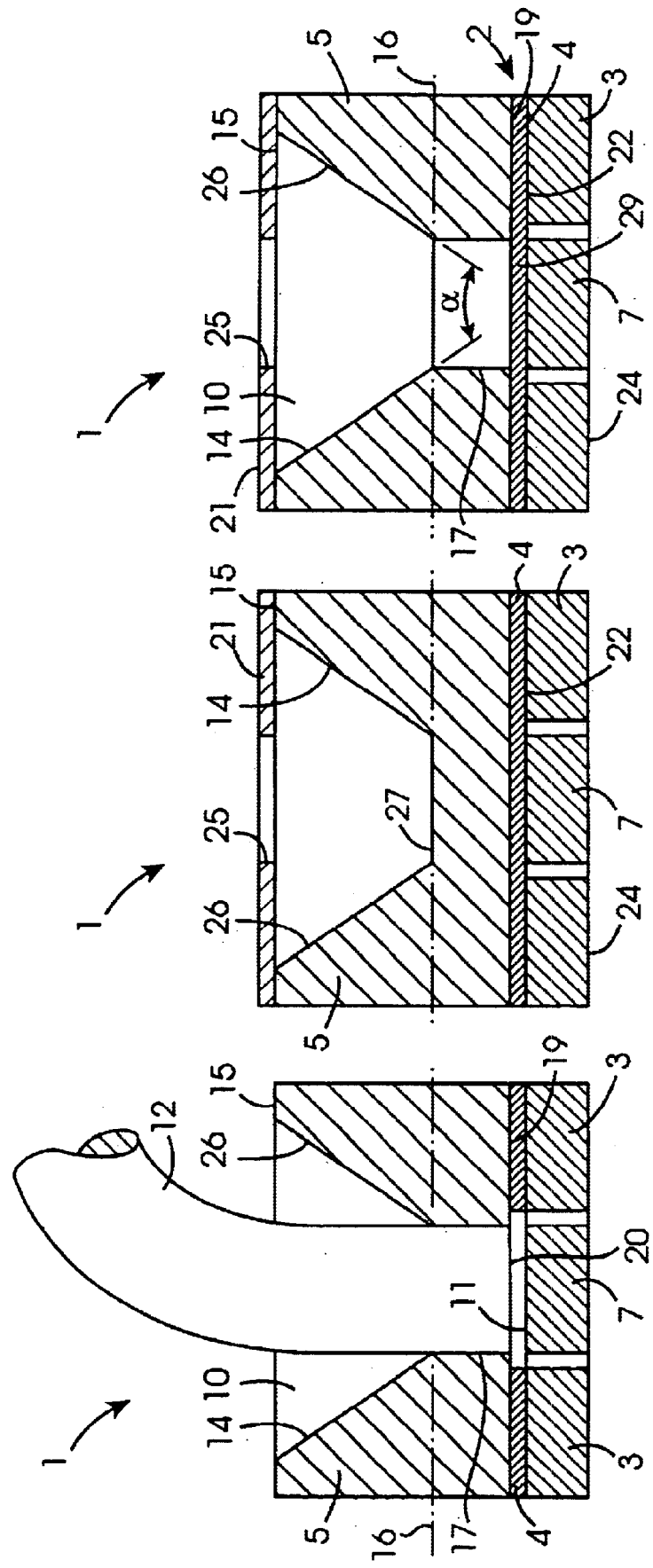

METHOD FOR ETCHING A TAPERED BORE IN A SILICON SUBSTRATE, AND A SEMICONDUCTOR WAFER COMPRISING THE SUBSTRATE

This application claims benefit of 60/342,597 filed Dec. 20, 2001.

FIELD OF THE INVENTION

The present invention relates to a method for etching a tapered bore into a silicon substrate from a first face thereof, and the invention also relates to a semiconductor wafer comprising a substrate layer having a tapered bore therein.

BACKGROUND TO THE INVENTION

Micro-machined components formed in a silicon device layer of a semiconductor wafer, in general, are formed in a relatively thin silicon device layer, which is supported on a handle layer. The device layer in which the micro-machined components are to be formed is laminated to the handle layer, which. In general, is also of silicon. In general, an oxide layer is formed between the handle layer and the device layer. The handle layer provides support to the relatively thin device layer within which the micro-machined components are formed. The oxide layer forms an electrical insulation barrier between the device layer and the handle layer. In general, it is necessary to be able to access such micro-machined components through the handle layer, and this requires the formation of access bores extending through the handle layer to the respective micro-machined components. In general, it is desirable that the access bores to such micro-machined components should be accurately aligned with the corresponding one of the micro-machined components, and additionally, it is desirable that the access bores should be accurately dimensioned, and in particular, the transverse cross-sectional area of such bores should be of accurate dimensions. For example, where it is desired to terminate an optical fibre extending through an access bore adjacent the corresponding micro-machined component, it is important that as well as being accurately aligned with the micro-machined component, the access bore should be accurately dimensioned in order to positively and accurately secure and locate the optical fibre relative to the micro-machined component. It is also desirable that such access bores be dimensioned to form a relatively tight fit around to the corresponding optical fibre in order that when the optical fibre is tightly located in the access bore, t e terminal end of the optical fibre is accurately aligned with the micro-machined component. In general, axial alignment of such access bores relative to the corresponding micro-machined component can be achieved without too much difficulty. However, the etching of such access bores of relatively accurate dimensions, particularly relatively accurate cross-sectional dimensions, presents considerable difficulties, and thus subsequent alignment problems when locating the optical fibre in the access bore relative to the micro-machined component.

Additionally, due to the fact that the optical fibre should be a relatively tight fit, and preferably, an interference fit in the access bore. It is desirable that a tapered lead in should be provided to the bore for facilitating initial insertion of the optical fibre into the access bore. This also is difficult to achieve with any degree of accuracy.

In known methods for forming such access bores, an anisotropic wet etch is used where the etchant may, for example, comprise a mixture of potassium hydroxide, iso-propylalcohol and water. In general. It is difficult to control the cross-sectional shape of an access bore in such wet etch processes. In particular, it is difficult to wet etch such access bores of regular circular cross-section. This is due to the fact that wet etches tend to etch along the crystalline plane of silicon, and typically, attempts to etch bores of circular cross-section tend to result in bores of square or rectangular cross-section. This is so irrespective of the etch opening formed in a mask through which the etchant is being directed at the silicon.

There is therefore a need for a method for etching a bore, and in particular, a tapered bore into a silicon substrate which overcomes these problems.

The present invention is directed towards providing such a method, and the invention is also directed towards providing a semiconductor wafer comprising a substrate layer having a bore etched therein by the method according to the invention.

SUMMARY OF THE INVENTION

According to the invention there is provided a method for etching a bore into a silicon substrate from a first face thereof, the method comprising the steps of:

forming a masking layer on the first face, patterning the masking layer to define an etch opening at a location corresponding to the location at which the bore is to be etched into the silicon substrate, subjecting the silicon substrate to a first dry etch through the etch opening for forming the bore to a first depth, the bore tapering inwardly from the first face to the first depth, subjecting the silicon substrate to a second dry etch through the etch opening on completion of the first etch for etching the bore to a second depth which is a greater distance from the first face than the distance of the first depth from the first face.

In one embodiment of the invention the transverse cross-sectional area of the portion of the bore extending between the first and second depths formed by the second etch is constant.

In another embodiment of the invention the portion of the bore tapers from the first face to the first depth to be of transverse cross-sectional area adjacent the first depth similar to the transverse cross-sectional area of the portion of the bore extending between the first and second depths at the first depth.

In a further embodiment of the invention the portion of the bore extending between the first face and the first depth, and the portion of the bore extending between the first depth and the second depth are of circular transverse cross-section.

In one embodiment of the invention the portion of the bore extending between the first face and the first depth tapers to define an included cone angle in the range of 30° to 90°.

In another embodiment of the invention the portion of the bore extending between the first face and the first depth tapers to define an included cone angle in the range of 35° to 60°.

In a further embodiment of the invention the portion of the bore extending between the first face and the first depth tapers to define an included cone angle of approximately 40°.

In one embodiment of the invention the area of the etch opening is less than the transverse cross-sectional area of the portion of the bore extending between the first and second depths at the first depth thereof. Preferably, the area of the etch opening is in the range of 80% to 90% of the transverse cross-sectional area of the portion of the bore extending between the first and second depths adjacent the first face of the silicon substrate. Advantageously, the area of the etch opening is approximately 85% of the transverse cross-sectional area of the portion of the bore extending between the first and second depths at the first depth thereof.

Preferably, the shape of the etch opening is of shape similar to the shape of the portion of the bore extending between the first and second depths at the first depth thereof.

In one embodiment of the invention the first and second etches are carried out in a controlled environment chamber.

In another embodiment of the invention the first etch is an isotropic etch.

In a further embodiment of the invention fluorine radicals are created in the controlled environment chamber during the first etch for reacting with the silicon substrate for releasing volatile by-products for forming the portion of the bore extending between the first face and the first depth. Preferably the first etch is carried out with an etchant preparation comprising sulphur hexafluoride. Advantageously, the pressure within the controlled environment chamber is maintained in the range of $5 \times 10^{-6}$ bar to $2 \times 10^{-4}$ bar during the first etch, and the DC bias voltage on the platen is controlled by maintaining input power to the platen in the range of 0 watts to 50 watts. Ideally, the pressure within the controlled environment chamber is maintained at approximately $7 \times 10^{-5}$ during the first etch, and the power to the platen is maintained at approximately 5 watts.

Alternatively, the first etch is an anisotropic etch, and is carried out using the Bosch process by sequentially alternating between etch cycles and deposition cycles, and the duration of the respective etch and deposition cycles is controlled for controlling the cone angle of the portion of the bore extending between the first face and the first depth.

In one embodiment of the invention the second etch is an anisotropic etch, and is carried out using the Bosch process by sequentially alternating between etch cycles and deposition cycles, and the duration of the respective etch and deposition cycles is controlled for maintaining the transverse cross-sectional area of the portion of the bore extending between the first depth and the second depth substantially constant.

In one embodiment of the invention during the second etch each etch cycle is of duration in the range of 3 seconds to 15 seconds, and the duration of each deposition cycle is in the range of 3 seconds to 7 seconds. Preferably, during the second etch the duration of each etch cycle is approximately 6 seconds, and the duration of each deposition cycle is approximately 5 seconds.

In one embodiment of the invention in each etch cycle of the second etch fluorine radicals are created in the controlled environment chamber for reacting with the silicon substrate for releasing volatile by-products for forming the portion of the bore extending between the first depth and the second depth. Preferably, the etch cycles of the second etch are carried out with an etchant preparation comprising sulphur hexafluoride. Preferably, a passivation layer is deposited during each deposition cycle of the second etch. Advantageously, the passivation layer deposited during each deposition cycle of the second etch is a fluorocarbon polymer layer.

In one embodiment of the invention the pressure in the controlled environment chamber during the second etch is maintained in the range of $2 \times 10^{-6}$ bar to $7 \times 10^{-5}$ bar during the second etch, and the DC bias voltage on the platen in the controlled environment chamber is controlled by maintaining the input power to the platen in the range of 0 watts to 30 watts. Preferably, the pressure in the controlled environment chamber is maintained at approximately $2 \times 10^{-5}$ bars during the second etch, and the DC bias voltage on the platen in the controlled environment chamber is controlled by maintaining the input power to the platen at approximately 10 watts.

Ideally, a passivation layer is deposited on the surface of the portion of the bore extending between the first face and the second depth on completion of the first etch for protecting the said surface during etching of the portion of the bore extending between the first depth and the second depth by the second etch.

In one embodiment of the invention the bore is an access bore extending through the silicon substrate from the first face thereof to the second depth alt a second face of the substrate opposite the first face for providing access to a micro-machined component in an adjacent device layer, and in another embodiment of the invention the access bore accommodates an optical fibre therethrough.

Further the invention provides a semiconductor wafer comprising a substrate layer of silicon, and a device layer having a micro-machined component formed in the device layer, a corresponding access bore extending through the substrate layer for providing access to the micro-machined component, the access bore being formed by the method according to the invention.

In one embodiment of the invention the access bore is aligned with the micro-machined component.

In another embodiment of the invention the substrate layer defines a first face and an opposite second face, and the micro-machined component layer is located adjacent the second face, the access bore comprising a portion tap ring from the first face to a first depth in the substrate layer, and a portion extending from the first depth to the second face of the substrate layer of substantially constant transverse cross-sectional area.

In one embodiment of the invention an optical fibre extends through the access bore, and preferably, the optical fibre is a tight fit in the access bore for securing the optical fibre in the access bore in axial alignment with the micro-machined component.

ADVANTAGES OF THE INVENTION

The advantages of the invention are many. The method according to the invention facilitates the formation of a bore through a silicon substrate which has an initial tapered lead-in portion leading into a portion of substantially constant transverse cross-sectional area. The method according to the invention permits the transverse cross-sectional dimensions of the bore to be controlled within relatively tight tolerances, and where it is desired to form the two portions of the bore to be of circular transverse cross-section, the transverse cross-sectional area can be maintained substantially circular throughout the length of the bore, both in the tapering portion of the bore and in the portion of substantially constant cross-sectional area. Accordingly, by virtue of the fact that the cross-sectional dimensions of the bore can be accurately determined and maintained, the bore is particularly suitable as an access bore for aligning with a micro-machined component in a device layer adjacent to the silicon substrate, and in particular, is suitable for aligning an optical fibre with the micro-machined component. The method is particularly suitable for forming a bore of circular transverse cross-section in which the cross-sectional area of the bore is accurately maintained circular. Thus, the method permits the accurate formation of access bores through a handle layer of a semiconductor wafer, which supports a device layer comprising a plurality of micro-machined components. By virtue of the fact that the method permits the formation of accurately shaped and dimensioned bores, and furthermore, by virtue of the fact that the bores can be accurately located in the handle layer, the bores are particularly suitable for facilitating accurate alignment of optical fibres and/or other components located in the bores with corresponding micro-machined components, such as, for example, micro-mirrors. By providing the accurately formed tapered portion of the bore, a suitable tapered lead-in is provided for facilitating insertion of an optical fibre or another component or components into the bore.

A further advantage of the method according to the invention is that by forming the access bore with a relatively long and wide angled tapered lead-in, an optical or other coating can be deposited onto the micro-machined component through the bore with precision. By virtue of the fact that the cross-section of the tapered lead-in portion of the bore is accurately dimensioned, shadowing effects which would otherwise arise when depositing a coating on a micro-machined component through a relatively long narrow bore are reduced, and depending on the length and the cross-section of the bore and the angle of the tapered lead-in may be eliminated. A further advantage of the method according to the invention is that by providing the access bore with the tapered lead-in, physical restrictions to incident and reflected optical light to and from the micro-machined component is minimised.

The invention and its advantages will be more clearly understood from the following description of a preferred embodiment thereof, which is given by way of example only, with reference to the accompanying drawings.

BRIEF DESCRIPTION OF THE DRAWINGS

FIG. 3 is a transverse cross-sectional side elevational view of a portion of the semiconductor wafer of FIG. 1, FIG. 6 is a transverse cross-sectional side elevational view similar to FIG. 3 of the semiconductor wafer of FIG. 1 being formed, and FIG. 7 is a transverse cross-sectional side elevational view similar to FIG. 3 of the semiconductor wafer of FIG. 1 also being formed.

DETAILED DESCRIPTION OF THE INVENTION

Figure 1:
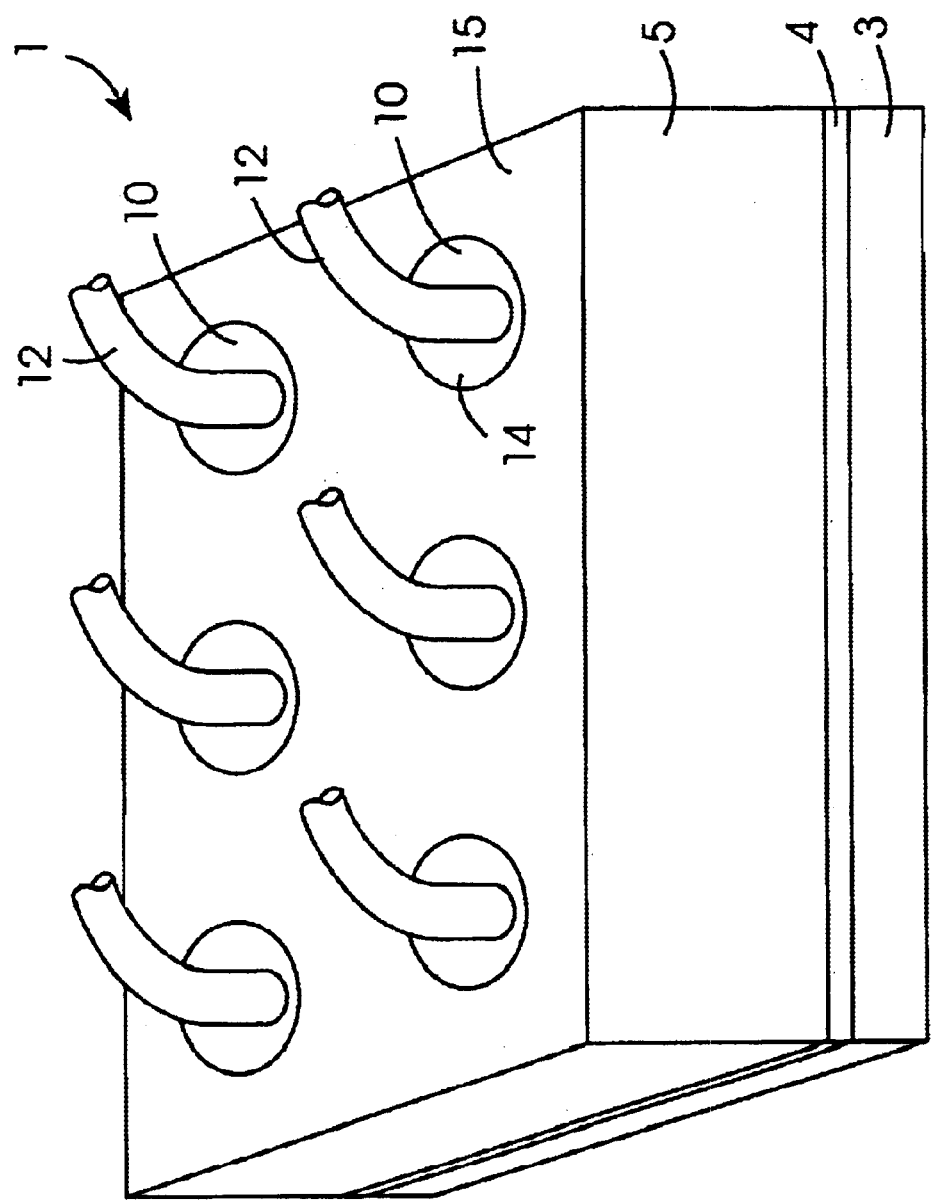
FIG. 1 is a top perspective view of a semiconductor wafer according to the invention.
Figure 2:
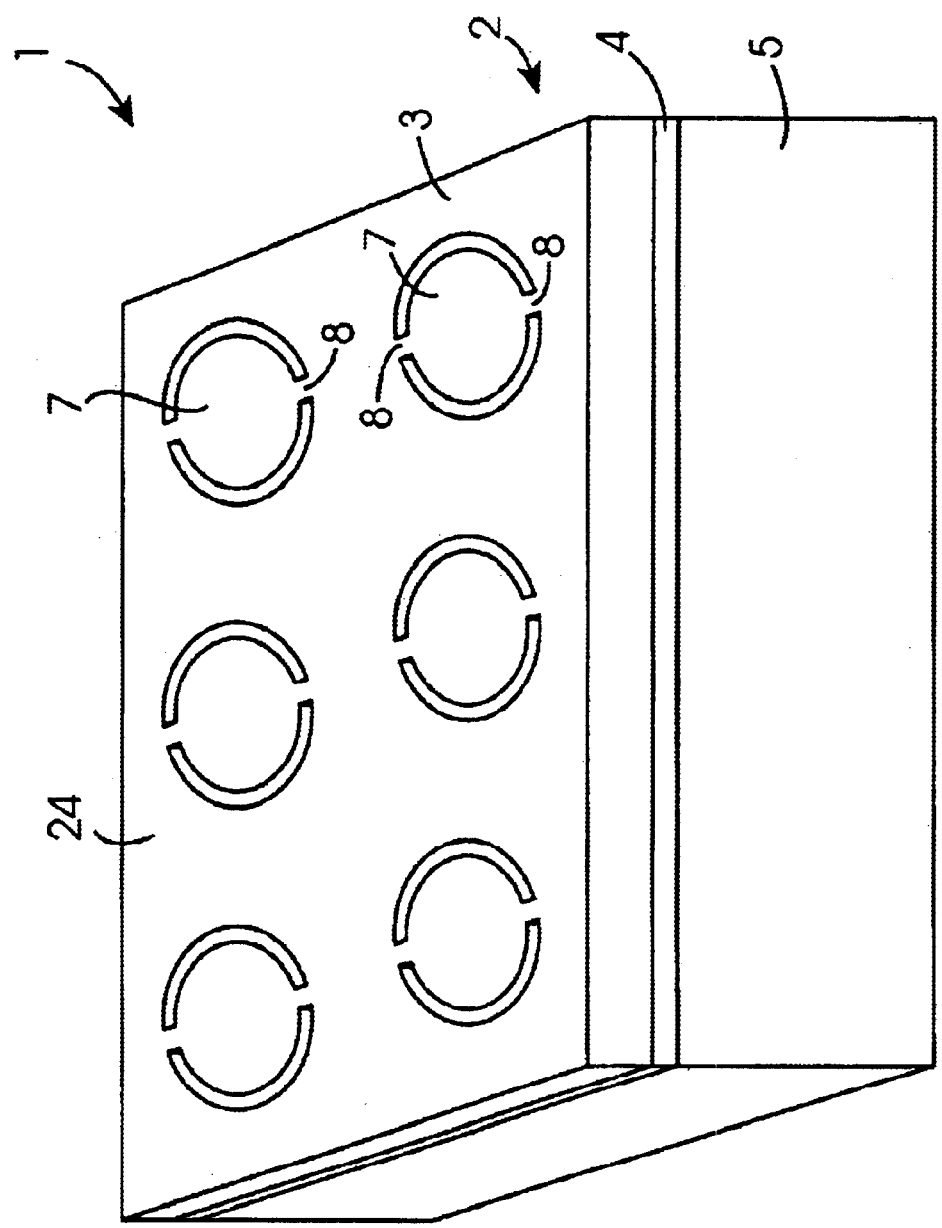
FIG. 2 is an underneath perspective view of the semiconductor wafer of FIG. 1.

Referring to the drawings, there is illustrated a semiconductor wafer according to the invention indicated generally by the reference numeral 1. The semiconductor wafer 1 comprises an SOI (silicon on oxide) 2, namely, a device layer 3 of silicon and an oxide layer 4. A handle layer 5 provided by a silicon substrate supports the SOI 2. The oxide layer 4 electrically insulates the device layer 3 from the handle layer 5. A plurality of micro-machined components, in this embodiment of the invention micro-mirrors 7 are formed in the device layer 3. For convenience the semiconductor wafer is illustrated in FIGS. 1 and 2 with only six micro-mirrors 7, however, it will be readily apparent to those skilled in the art that any number of micro-mirrors may be formed in the device layer 3, and typically, a matrix array of four by four micro-mirrors 7 would be formed in the device layer 3. Tethers 8 located at 90° intervals around the micro-mirrors 7 extend from the device layer 3 to the micro-mirrors 7 for supporting the micro-mirrors 7 in the device layer 3, and for permitting angular deflection of the micro-mirrors 7 about axes defined by the tethers 8 as will be well known by those skilled in the art. A plurality of access bores 10, one bore 10 being provided for each micro-mirror 7, extend through the handle layer 5 and the oxide layer 4 to the micro-mirrors 7. The access bores 10 are aligned with the micro-mirrors 7 for accommodating and locating corresponding optical fibres 12 relative to the micro-mirrors 7 for conducting light to the micro-mirrors 7, and for conducting reflected light from respective reflective inner surfaces 11 of the micro-mirrors 7.

The micro-mirrors 7 are circular, and the access bores 10 are of circular transverse cross-section. Each access bore 10 comprises a tapered lead-in portion 14 extending from a first face 15 of the handle layer 5 and tapering inwardly to a first depth 16 within the handle layer 5. A parallel sided portion 17 of each access bore 10 extends from the first depth 16 to a second depth which coincides with a second face 19 of the handle layer 5. The parallel portion 17 of each access bore 10 also extends through the oxide layer 4 to the corresponding micro-mirror 7, however, the portion of the access bore 10 extending through the oxide layer is of larger diameter than that of the parallel portion 17 of the access bore 10. The tapered lead-in portion 14 defines a cone angle α, see FIG. 7, in this embodiment of the invention of approximately 40°, and forms a lead-in for the corresponding optical fibre 12 to the parallel portion 17. In this embodiment of the invention the diameter of the tapered lead-in portions 14 at the first depth 16 is similar to the diameter of the parallel portions 17, in order to ensure a smooth transition between the tapered lead-in portions 14 and the corresponding parallel portions 17 of the access bores 10.

The access bores 10, as will be described below, are etched through the handle layer 5 and the oxide layer 4 in an etching process which axially accurately aligns the access bores 10 with the corresponding micro-mirrors 7, and also forms the access bores 10 of relatively accurate cross-sectional dimension, so that the optical fibres 12 when engaged in the parallel portions 17 of the corresponding access bores 10 are accurately secured in the access bores 10, and are accurately axially aligned with the corresponding micro-mirrors 7.

The optical fibres 12 may be inserted into the corresponding access bores 10 so that respective ends 20 terminate at any desired location in the parallel portions 17 of the access bores 10. However, in this embodiment of the invention the ends 20 of the optical fibres 12 terminate at the second face 19 of the handle layer 5. The diameter of the parallel portion 17 of each access bore 10 may be any desired diameter in order to secure the corresponding optical fibre 12 therein. In this embodiment of the invention in order to ensure particularly accurate alignment of the optical fibres 12 with the corresponding micro-mirrors 7, the parallel portions 17 of the bores 10 are formed to have a diameter such that the optical fibres 12 engage the parallel portions 17 with an interference type fit.

The method for forming the semiconductor wafer 1 will now be described. A first silicon wafer of the desired silicon material of depth in the range 400 microns to 800 microns for forming the device layer 3 is selected. A second silicon wafer of the desired type of silicon for forming the handle layer 5 is also selected. The second silicon wafer is machined to the desired depth of the handle layer which typically is in the range of 300 microns to 400 microns. The oxide layer 4 is grown on the handle layer 5 to a depth of approximately 3 microns to define a surface 22 parallel to the second face 19 of the handle layer 5, see FIGS. 6 and 7. The first silicon wafer to form the device layer 3 is then fusion bonded to the oxide layer 4 by suitable high temperature anneal. The first wafer is then machined and ground to the desired depth to form the device layer 3, which in this embodiment of the invention is in the range of 2 microns to 50 microns, depending on the type of mirrors.

A photoresist masking layer (not shown) is applied to the surface 24 of the device layer 3, which is patterned to define the micro-mirrors 7 and the tethers 8. The device layer 3 is then etched through the patterned photoresist masking layer (not shown) to the oxide layer 4 which acts as an etch stop layer to form the micro-mirrors 7 and the tethers B. Once the micro-mirrors 7 and tethers 8 have been formed, the photoresist masking layer on the surface 24 of the device layer 3 is removed.

Figure 5:
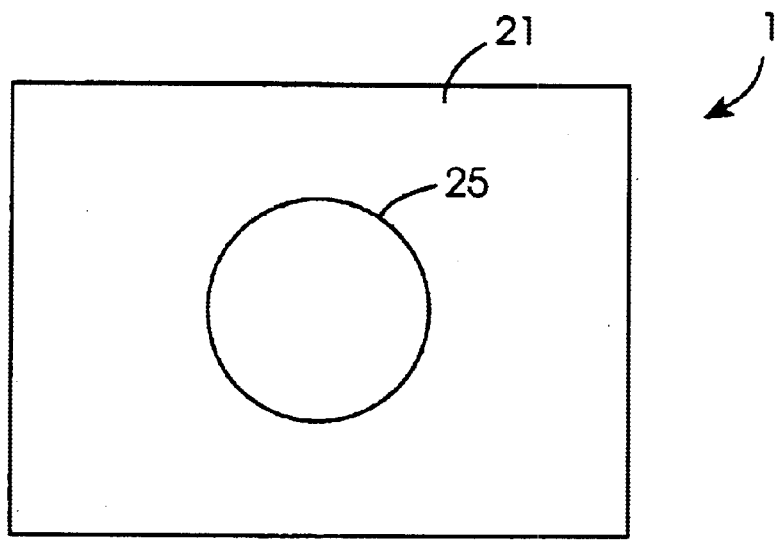
FIG. 5 is a top plan view of the portion of FIG. 3 of the semiconductor wafer of FIG. 1 being formed.
Figure 4:
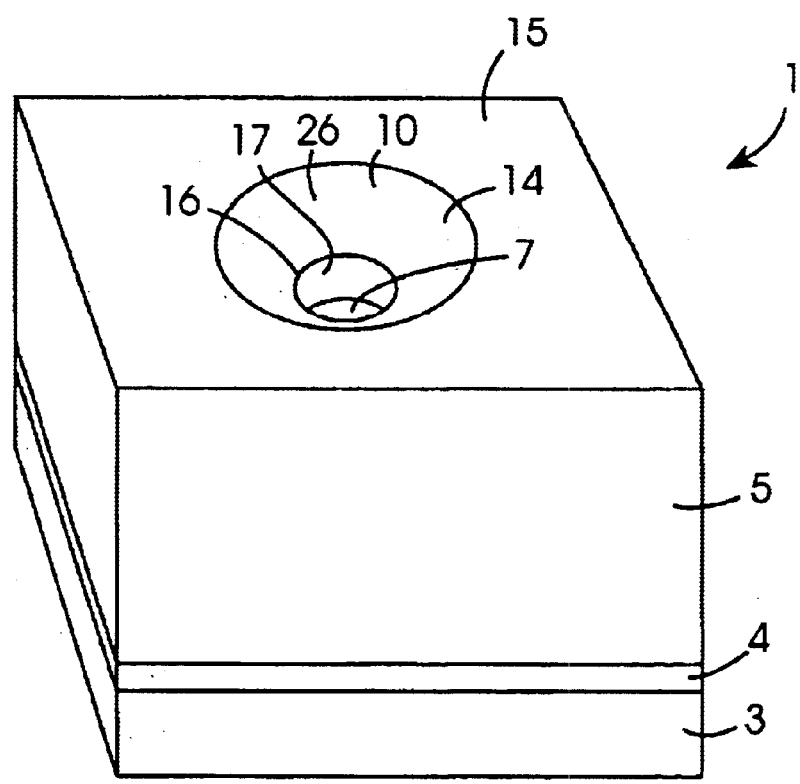
FIG. 4 is a perspective view of the portion of FIG. 3 of the semiconductor wafer of FIG. 1 with a portion removed.

The next step is the formation of the access bores 10 in the handle layer 5. A photoresist masking layer 21 is laid down on the first face 15 of the handle layer 5, and is patterned to define a plurality of circular etch openings 25 which correspond to the positions at which the access bores 10 are to be formed, see FIGS. 5 to 7 where the masking layer 21 is illustrated with one etch opening 25 formed therein. The etch openings 25 are accurately axially aligned with the micro-mirrors 7, and the diameter of each etch opening 25 defined by the photoresist masking layer 21 on the first face 15 is of diameter just less than the desired diameter of the parallel portion 17 of the corresponding access bore 10. In this embodiment of the invention the diameter of each etch opening 25 is approximately 85% of the desired diameter of the parallel portion 17 of the corresponding access bore 10, although the diameter of the etch opening may be in the range of 80%/o to 90% of the diameter of the parallel portion 17. The tapered lead-in portion 14 is initially etched to the first depth 16, and then the parallel portion 17 is etched from the first depth 16 to the second face 19 of the handle layer 5. On the parallel portions 17 of the access bores 10 reaching the second face 19, the oxide layer 4 acts as an etch stop layer.

The etching of the tapered lead-in portion 14 and the parallel portion 17 of the respective access bores 10 are etched in an etch chamber (not shown), in this embodiment of the invention an inductively coupled plasma RIE (reactive ion etching) chamber. The tapered lead-in portions 14 of the access bores 10 are etched by a first dry etch through the etch opening 25. The first dry etch in this embodiment of the invention is an isotropic etch using a sulphur hexafluoride ($SF_6$) etchant. The DC bias voltage on the platen in the etch chamber is appropriately set by setting a low frequency generator which applies the voltage to the platen at a frequency of approximately 380 KHz, and by setting the duty cycle and frequency of the pulse generator such that the duty cycle supplies power for between 25% and 50% of the cycle at a frequency of between 50 Hz and 100 Hz. The input power from the pulse generator to the platen is set at approximately 5 watts. The pressure in the etch chamber is set at approximately $7 \times 10^{-5}$ bar. These settings have been found to be the optimum settings for producing the tapered lead-in portion 14 with a cone angle of 40°. However, different settings may be selected for different cone angles, and this will be understood by those skilled in the art. However, in general, the pressure in the etch chamber would be selected to lie in the range $5 \times 10^{-6}$ bar to $2 \times 10^{-4}$ bar, and the power would be selected to lie in the range 0 watts to 50 watts.

The sulphur hexafluoride ($SF_6$) etchant etches the silicon of the handle layer 5 by initially dissociating relatively inert molecules into atomic fluorine radicals in the following reaction:

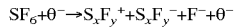

to yield ion assisted fluorine radicals. The ion assisted fluorine radicals etch the silicon to form the tapered lead-in portions 14 of the access bores 10 in the following reaction:

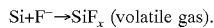

The first dry isotropic etch is continued until the tapered lead-in portions 14 extend to the first depth 16. At this stage the first etch is terminated.

The parallel portions 17 of the access bores 10 are etched by a second dry etch through the etch openings 25. However, before commencing the second dry etch the semiconductor wafer 1 is subjected to a short polymer deposition cycle for depositing a relatively thin layer of passivation, in this embodiment of the invention a fluorocarbon polymer layer on the tapering surface 26 of the tapered lead-in portions 14 and on a base portion 27 of the tapered lead-in portions 14 at the first depth 16. The fluorocarbon polymer layer prevents further etching of the tapered lead-in portions 14 while the parallel portions 17 are being etched by the second dry etch. However, due to the fact that the fluorocarbon polymer layer on the base portions 27 of the tapered lead-in portions 14 is subjected to direct bombardment through the etch openings 25 during the second dry etch, the fluorocarbon polymer layer is initially etched from the base portion 27 on commencement of the second dry etch. The fluorocarbon polymer layer on the tapering surfaces 26 of the tapered lead-in portions 14 of the access bores 10 is protected from direct bombardment during the second etch by the cantilevered portions of the masking layer 21 extending around the etch openings 25 over the tapering surfaces 26, and thus remains intact during the second etch.

The deposition cycle for depositing the fluorocarbon polymer layer on the tapering surface 26 and the base portion 27 of the tapered lead-in portions 14 of the access bores 10 is carried out by introducing octafluorocyclobutane ($C_4F_8$) into the etch chamber. By ionisation and dissociation the fluorocarbon polymer layer is formed in the following reaction:

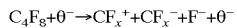

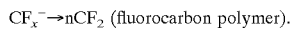

On completion of the short polymer deposition cycle, the second dry etch is commenced.

In this embodiment of the invention the second dry etch is an anisotropic etch which is carried out utilising the Bosch process, described in U.S. Pat. No. 5,501,893 of Laemer and Schilp. The Bosch process, as will be well known to those skilled in the art, comprises alternating etch and deposition cycles. The Bosch process is controlled so that by controlling the duration of the respective etch and deposition cycles the parallel portions 17 of the access bores 10 are formed with parallel sides, in other words, the parallel portions 17 of each bore 10 defines a cylinder. The etching of the parallel portions 17 of the access bores 10 is carried out in the same etch chamber, in which the first etch was carried out, using the Bosch process modified by the advanced silicon etch (ASE) developed by Surface Technology Systems which will be well known to those skilled in the art. The settings for the etch chamber during each etch cycle of the Bosch process are similar to those described for etching of the tapered lead-in portions 14, with the exception that the power setting is increased to 10 watts and the pressure in the etch chamber is set at $2 \times 10^{-5}$ bar, although the power setting may lie in the range 0 watts to 30 watts, and the pressure setting may lie in the range $2 \times 10^{-6}$ bar to $7 \times 10^{-5}$ bar. The duration of the etch and deposition cycles are set. The time duration of each etch cycle is ideally set between 3 seconds and 15 seconds, while the duration of each deposition cycle is set between 3 seconds and 7 seconds. The shorter the etch and deposition cycles within the above range are set, the smoother will be the surface of the parallel portions 17 of the access bores 10. Where longer cycle times are chosen, the surface of the parallel portions 17 of the access bores 10 will be less smooth due to the formation of wider and deeper scalloped grooves extending around the circumference of the parallel portions 17 of the access bores 10. This will be well known to those skilled in the art. A preferred duration of etch cycle is 6 seconds, while a preferred duration of deposition cycle is 5 seconds.

During each etch cycle of the Bosch process of the second dry etch, sulphur hexafluoride is introduced into the etch chamber and is dissociated to create fluorine radicals as already described with reference to the first dry etch. The fluorocarbon polymer layer which had been previously deposited on the base surface 27 of the tapered portions 14 of the access bores 10 is readily removed during the first etch cycle of the Bosch process, physically by direct ion bombardment and chemically by the fluorine etch, while the fluorocarbon polymer layer on the tapering surfaces 26 of the access bores 10 remains intact. The following is the reaction which removes the fluorocarbon polymer layer from the base surface 27 of the tapered lead-in portions 14 of the access bores 10:

$$nCF_2 + F^- \rightarrow CF_x^- \rightarrow CF_2 \text{ (volatile gas).}$$

On removal of the fluorocarbon polymer layer on the base portions 27 the first etch cycle of the second dry etch is continued, thus exposing the silicon of the handle layer 5 at the first depth 16 to the fluorine radical, thereby commencing etching of the parallel portions 17 of the access bores 10 from the first depth 16. The reaction between the fluoride radicals and the silicon for forming the parallel portions 17 of the access bores 10 during each etch cycle of the second dry etch is similar to that of the first etch:

$$Si + F^- \rightarrow SiF_x \text{ (volatile gas).}$$

In each deposition cycle of the Bosch process passivation layer, in this case a fluorocarbon polymer layer is laid down, and this is similar to the deposition of the fluorocarbon polymer layer which is laid down on the tapered lead-in portions 14 of the access bore 10 after the etching of the tapered lead-in portions 14 has been completed.

Thereafter, by sequentially alternating the etch and deposition cycles, the parallel portions 17 of the access bores 10 are etched through the handle layer 5 from the first depth 16 to the second face 19 of the handle layer 5, at which stage the oxide layer 4 acts as an etch stop, and the second dry etch is terminated.

The semiconductor wafer 1 may then be subjected to a further clean-up etch in the etch chamber for smoothing the tapered surfaces 26 of the tapered lead-in portions 14 and the sides of the parallel portions 17 of the access bores 10. The clean-up etch may be identical to the isotropic etch used for etching the tapered lead-in portions 14 of the bores 10, although in many cases a clean-up etch may not be required. At an appropriate time either before or after removal of the masking layer 21 the semiconductor wafer 1 is subjected to a suitable etch for removing portions 29 of the oxide layer 4 for forming the remainder of the access bores 10 through the oxide layer 4 to the micro-mirrors 7. Any suitable etch may be used, and typically, a wet etch would be used, for example, a water diluted hydrofluoric acid etch.

Further processing of the semiconductor wafer may be carried out, and at an appropriate time the optical fibres 12 are inserted into the access bores 10 through the tapered lead-in portions 14, and are then engaged in the parallel portions 17 so that the ends 20 of the optical fibres 12 terminate at an appropriate depth in the parallel portions 17 of the access bores 10.

Prior to insertion of the optical fibres 12 in the access bores 10, the inner surfaces 11 of the micro-mirrors 7 may be coated through the access bores 10, for example, with a highly reflective coating, or an anti-reflective coating, depending on the use to which the micro-mirrors are to be put. By virtue of the fact that the access bores 10 are provided with the tapered lead-in portions 14, shadowing effects are minimised, and such reflective or anti-reflective coatings can be deposited on the inner surfaces 11 of the micro-mirror 7 with a relatively high degree of accuracy.

While the handle layer and the device layer have been described as being selected from silicon wafers of particular ranges of thickness, the device layer and the handle layer may be selected from wafers of any suitable thickness. Needless to say, while the device layer and the handle layer have been described as being machined to specific thicknesses, the thicknesses of the silicon and handle layers may be any desired thickness, and similarly, the thickness of the oxide layer may be any suitable or desired thickness.

While the first etch has been described as being an isotropic etch, it is envisaged that the first etch may be carried out utilising the Bosch process as described with reference to the second etch for etching the parallel portions 17 of the bores 10, with the exception that the parameters of the etch chamber would be ramped in order to achieve the taper in the tapered lead-in portions. Typically, the durations of the etch and deposition cycles would be ramped for achieving the appropriate angle $\alpha$ of the tapered lead-in portions.

It will of course be appreciated that while the tapered lead-in portions have been described as being of cone angle of approximately 40°, the tapered lead-in portions may be of any desired angle. Other angles of taper would be achieved by appropriately altering the parameters of the isotropic or anisotropic etch being used to form the tapered lead-in portions.

Additionally, while the etchant used in the respective first and second dry etches has been described as being sulphur hexafluoride, any other suitable etchant may be used. Furthermore, any other suitable passivation layer may be deposited, both at the end of the first etch and during the deposition cycles of the second etch.

Additionally, while the oxide layer has been described as being grown on the handle layer, the oxide layer instead of being grown could be deposited. It is also envisaged that instead of either growing or depositing the oxide layer on the handle layer, the oxide layer could be deposited or grown on the device layer. Indeed, it is envisaged that in certain cases the oxide layer may be formed both on the handle layer and the device layer and after formation could be densified if desired on the respective device layer and the handle layer, and additionally, if desired could be machined to the appropriate depths so that when bonded together the respective oxide layers on the device layer and the handle layer would together form the oxide layer of the desired depth. The bonding could be carried out by any suitable bonding process, for example, high temperature annealing.

While a specific type of tether for mounting the micro-mirrors in the device layer has been described, any other suitable tether mounting of the mirrors may be used, and such tether mountings will be well known to those skilled in the art. Indeed, in certain cases it is envisaged that the micro-mirrors may be gimbal mounted to the device layer.

It will of course be appreciated that while the semiconductor wafer has been described as comprising a matrix of micro-mirrors, the semiconductor wafer may be provided with a single micro-mirror.

What is claimed is:

1. A method for etching a bore into a silicon substrate from a first face thereof, the method comprising the steps of:
    forming a masking layer on the first face,
    patterning the masking layer to define an etch opening at a location corresponding to the location at which the bore is to be etched into the silicon substrate,
    subjecting the silicon substrate to a first dry etch in a controlled environment chamber through the etch opening for forming the bore to a first depth, the bore tapering inwardly from the first face to the first depth and defining a cone angle, the first dry etch being carried
out using the Bosch process whereby the silicon substrate is sequentially subjected to alternating etch and deposition cycles through the etch opening, the duration of the respective etch and deposition cycles being controlled for controlling the cone angle defined by the bore extending between the first face and the first depth, and
    subjecting the silicon substrate to a second dry etch in the controlled environment chamber through the etch opening on completion of the first etch for etching the bore to a second depth which is a greater distance from the first face than the distance of the first depth from the first face.

2. A method as claimed in claim 1 in which the transverse cross-sectional area of the portion of the bore extending between the first and second depths formed by the second etch is constant.

3. A method as claimed in claim 1 in which the portion of the bore tapers from the first face to the first depth to be of transverse cross-sectional area adjacent the first depth similar to the transverse cross-sectional area of the portion of the bore extending between the first and second depths at the first depth.

4. A method as claimed in claim 1 in which the portion of the bore extending between the first face and the first depth, and the portion of the bore extending between the first depth and the second depth are of circular transverse cross-section.

5. A method as claimed in claim 1 in which the portion of the bore extending between the first face and the first depth tapers to define an included cone angle in the range of 30° to 90°.

6. A method as claimed in claim 1 in which the portion of the bore extending between the first face and the first depth tapers to define an included cone angle in the range of 35° to 60°.

7. A method as claimed in claim 1 in which the portion of the bore extending between the first face and the first depth tapers to define an included cone angle of approximately 40°.

8. A method as claimed in claim 1 in which the area of the etch opening is less than the transverse cross-sectional area of the portion of the bore extending between the first and second depths at the first depth thereof.

9. A method as claimed in claim 8 in which the area of the etch opening is in the range of 80% to 90% of the transverse cross-sectional area of the portion of the bore extending between the first and second depths adjacent the first face of the silicon substrate.

10. A method as claimed in claim 9 in which the area of the etch opening is approximately 85% of the transverse cross-sectional area of the portion of the bore extending between the first and second depths at the first depth thereof.

11. A method as claimed in claim 1 in which the shape of the etch opening is of shape similar to the shape of the portion of the bore extending between the first and second depths at the first depth thereof.

12. A method as claimed in claim 1 in which the first etch is an isotropic etch.

13. A method as claimed in claim 12 in which fluorine radicals are created in the controlled environment chamber during the first etch for reacting with the silicon substrate for releasing volatile by-products for forming the portion of the bore extending between the first face and the first depth.

14. A method as claimed in claim 13 in which the first etch is carried out with an etchant preparation comprising sulphur hexafluoride.

15. A method as claimed in claim 12 in which the pressure within the controlled environment chamber is maintained in the range of $5 \times 10^{-6}$ bar to $2 \times 10^{-4}$ bar during the first etch, and the DC bias voltage on the platen is controlled by maintaining input power to the platen in the range of 0 watts to 50 watts.

16. A method as claimed in claim 15 in which the pressure within the controlled environment chamber is maintained at approximately $7 \times 10^{-5}$ bar during the first etch, and the power to the platen is maintained at approximately 5 watts.

17. A method as claimed in claim 1 in which the second etch is an anisotropic etch, and is carried out using the Bosch process by sequentially alternating between etch cycles and deposition cycles, and the duration of the respective etch and deposition cycles is controlled for maintaining the transverse cross-sectional area of the portion of the bore extending between the first depth and the second depth substantially constant.

18. A method as claimed in claim 17 in which during the second etch each etch cycle is of duration in the range of 3 seconds to 15 seconds, and the duration of each deposition cycle is in the range of 3 seconds to 7 seconds.

19. A method as claimed in claim 18 in which during the second etch the duration of each etch cycle is approximately 6 seconds, and the duration of each deposition cycle is approximately 5 seconds.

20. A method as claimed in claim 17 in which in each etch cycle of the second etch fluorine radicals are created in the controlled environment chamber for reacting with the silicon substrate for releasing volatile by-products for forming the portion of the bore extending between the first depth and the second depth.

21. A method as claimed in claim 20 in which the etch cycles of the second etch are carried out with an etchant preparation comprising sulphur hexafluoride.

22. A method as claimed in claim 17 in which a passivation layer is deposited during each deposition cycle of the second etch.

23. A method as claimed in claim 22 in which the passivation layer deposited during each deposition cycle of the second etch is a fluorocarbon polymer layer.

24. A method as claimed in claim 17 in which the pressure in the controlled environment chamber during the second etch is maintained in the range of $2\times10^{-6}$ bar to $7\times10^{-5}$ bar during the second etch, and the DC bias voltage on the platen in the controlled environment chamber is controlled by maintaining the input power to the platen in the range of 0 watts to 30 watts.

25. A method as claimed in claim 24 in which the pressure in the controlled environment chamber is maintained at approximately $2\times10^{-5}$ bars during the second etch, and the DC bias voltage on the platen in the controlled environment chamber is controlled by maintaining the input power to the platen at approximately 10 watts.

26. A method as claimed in claim 1 in which a passivation layer is deposited on the surface of the portion of the bore extending between the first face and the first depth on completion of the first etch for protecting the said surface during etching of the portion of the bore extending between the first depth and the second depth by the second etch.

27. A method as claimed in claim 1 in which the bore is an access bore extending through the silicon substrate from the first face thereof to the second depth at a second face of the substrate opposite the first face for providing access to a micro-machined component in an adjacent device layer.

28. A method as claimed in claim 27 in which the access bore accommodates an optical fibre therethrough.

\* \* \* \* \*

UNITED STATES PATENT AND TRADEMARK OFFICE
CERTIFICATE OF CORRECTION

PATENT NO. : 6,818,564 B1  
APPLICATION NO. : 10/324603  
DATED : November 16, 2004  
INVENTOR(S) : Colin Stephen Gormley Page 1 of 1

It is certified that error appears in the above-identified patent and that said Letters Patent is hereby corrected as shown below:

Column 1, line 22:
-please delete "layer, which. In general, is also of silicon." and add --layer, which, in general is also of silicon.--

Column 1, line 48:
-please delete "access bore, t e terminal end of" and add --access bore, the terminal end of--

Column 1, line 61:
-please delete "the access bore. It is desirable" and add --the access bore, it is desirable--

Column 2, line 1:
-please delete "In general. It is difficult" and add --In general, it is difficult--

Column 4, line 17:
-please delete "second depth alt a second" and add --second depth at a second--

Column 4, line 34:
-please delete "comprising a portion tap ring" and add --comprising a portion tapering--

Signed and Sealed this

Twelfth Day of December, 2006

JON W. DUDAS  
*Director of the United States Patent and Trademark Office*

UNITED STATES PATENT AND TRADEMARK OFFICE
CERTIFICATE OF CORRECTION

PATENT NO. : 6,818,564 B1
APPLICATION NO. : 10/324603
DATED : November 16, 2004
INVENTOR(S) : Colin Stephen Gormley It is certified that error appears in the above-identified patent and that said Letters Patent is hereby corrected as shown below:

Column 8, lines 11, 12, & 13:
-please delete "$SF_6 + 0^- \rightarrow S_xF_y^+ + S_xF_y^- + F^- + 0^-$" and replace with --$SF_6 + e^- \rightarrow S_xF_y^+ + S_xF_y^- + F^- + e^-$--

Column 8, lines 16, 17, & 18:
-please delete "$Si + F^- \rightarrow SiF_x$ (volatile gas)." and replace with --$Si + F \rightarrow SiF_x$ (volatile gas).--

Column 8, lines 52, 53, & 54:
-please delete "$C_4F_8 + 0^- \rightarrow CF_x^+ + CF_x^- + F^- + 0^-$
$CF_x^- \rightarrow nCF_2$ (fluorocarbon polymer)."
and replace with
--$C_4F_8 + e^- \rightarrow CF_x^+ + CF_x + F + e^-$
$CF_x \rightarrow nCF_2$ (fluorocarbon polymer).--

Column 9, lines 41 & 42:
-please delete "$nCF_2 + F^- \rightarrow CF_x^- \rightarrow CF_2$ (volatile gas)." and replace with --$nCF_2 + F \rightarrow CF_x \rightarrow CF_2$ (volatile gas).--

Column 9, lines 52 & 53:
- please delete "$Si + F^- \rightarrow SiF_x$ (volatile gas)." and replace with --$Si + F^- \rightarrow SiF_x$ (volatile gas).--

Signed and Sealed this

Thirteenth Day of March, 2007

JON W. DUDAS
*Director of the United States Patent and Trademark Office*